United States Patent
Panwar et al.

(10) Patent No.: US 11,119,149 B2
(45) Date of Patent: Sep. 14, 2021

(54) DEBUG COMMAND EXECUTION USING EXISTING DATAPATH CIRCUITRY

(71) Applicant: Western Digital Technologies, Inc., San Jose, CA (US)

(72) Inventors: Deepak Panwar, Austin, TX (US); Muhammad Tauseef Rab, Austin, TX (US); Robert T. Golla, Austin, TX (US); Matthew B. Smittle, Allen, TX (US)

(73) Assignee: Western Digital Technologies, Inc., San Jose, CA (US)

( * ) Notice: Subject to any disclaimer, the term of this patent is extended or adjusted under 35 U.S.C. 154(b) by 77 days.

(21) Appl. No.: 16/264,039

(22) Filed: Jan. 31, 2019

(65) Prior Publication Data
US 2020/0174071 A1 Jun. 4, 2020

Related U.S. Application Data

(60) Provisional application No. 62/773,870, filed on Nov. 30, 2018.

(51) Int. Cl.
*G06F 9/30* (2018.01)
*G01R 31/317* (2006.01)
*G06F 11/263* (2006.01)

(52) U.S. Cl.
CPC ... *G01R 31/31705* (2013.01); *G06F 9/30029* (2013.01); *G06F 9/30141* (2013.01); *G06F 11/263* (2013.01)

(58) Field of Classification Search
None
See application file for complete search history.

(56) References Cited

U.S. PATENT DOCUMENTS

| 5,544,311 A | * | 8/1996 | Harenberg | G06F 11/2236 714/30 |
| 5,615,331 A | | 3/1997 | Toorians et al. | |
| 6,591,378 B1 | | 7/2003 | Arends et al. | |

(Continued)

OTHER PUBLICATIONS

Tim Newsome, et al., "RISC-V External Debug Support; Version 0.13.1-DRAFT; 70da60cec1f57df61b68e8f2ef9675dae71b7486," SiFive, Inc., Mon Nov. 5 13:08:38 2018-0800, 107 pages.

*Primary Examiner* — Corey S Faherty
(74) *Attorney, Agent, or Firm* — Kowert, Hood, Munyon, Rankin & Goetzel, P.C.

(57) ABSTRACT

Techniques are disclosed relating to using non-debug path circuitry to perform debug commands. In some embodiments, an apparatus includes a processor core that includes path circuitry configured to access data for instructions executed by the processor core and storage elements which the path circuitry is configured to access via one or more ports. In some embodiments, the apparatus includes debug circuitry configured to receive external debug inputs and send abstract commands to the processor core based on the external debug inputs. In some embodiments, the apparatus includes control circuitry in the processor core configured to, in response to an abstract command to access one or more of the storage elements: generate signaling to access the one or more storage elements using the path circuitry, access read data from the one or more storage elements based on the signaling, and transmit the accessed read data to the debug circuitry.

15 Claims, 6 Drawing Sheets

(56) References Cited

U.S. PATENT DOCUMENTS

| | | |
|---|---|---|
| 8,166,361 B2 | 4/2012 | Ong |
| 9,158,661 B2 * | 10/2015 | Blaine ................. G06F 11/3648 |
| 9,223,678 B2 | 12/2015 | Moyer et al. |
| 9,710,359 B2 * | 7/2017 | Pathirane ............ G06F 11/3636 |
| 2002/0065646 A1 * | 5/2002 | Waldie ................ G06F 11/3648 |
| | | 703/26 |
| 2006/0248391 A1 * | 11/2006 | Glover ................ G06F 11/3648 |
| | | 714/30 |

* cited by examiner

DEBUG COMMAND EXECUTION USING EXISTING DATAPATH CIRCUITRY

This application claims the benefit of U.S. Provisional Application No. 62/773,870, filed on Nov. 30, 2018, which is incorporated by reference herein in its entirety.

BACKGROUND

Technical Field

This disclosure relates generally to hardware debugging and more particularly to using existing datapath circuitry to execute debug commands.

Description of the Related Art

Hardware debug circuitry may be important in various scenarios to detect and correct processor issues. In some scenarios, a processor receives debug commands from an external interface and implements abstract debug commands. Speaking generally, debug circuitry may contribute to chip area and complexity.

Figure 1:
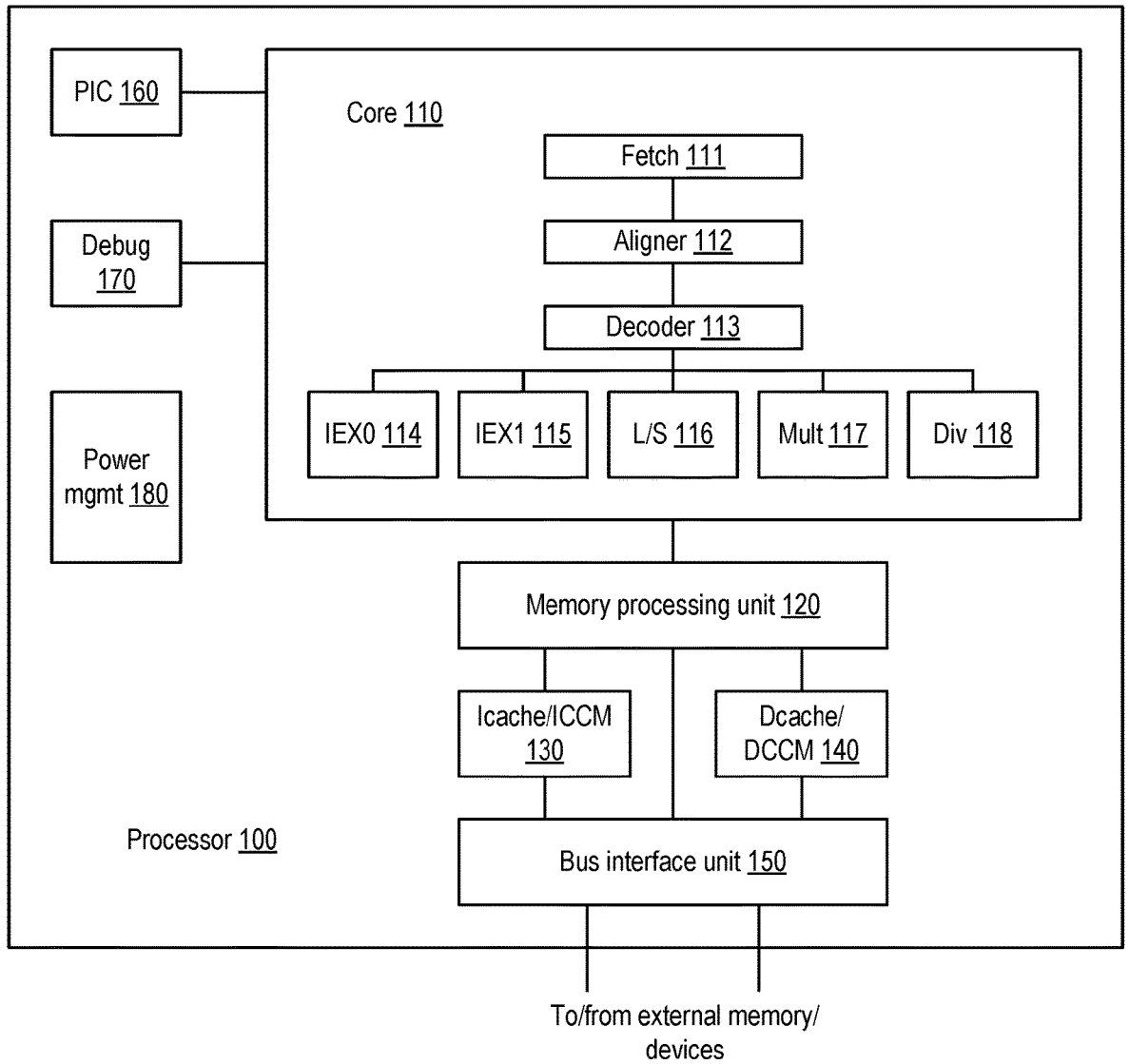
FIG. 1 is a block diagram illustrating an example processor, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. "Control circuitry configured to intercept read data" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

Further, as used herein, the terms "first," "second," "third," etc. do not necessarily imply an ordering (e.g., temporal) between elements. For example, a referring to a "first" graphics operation and a "second" graphics operation does not imply an ordering of the graphics operation, absent additional language constraining the temporal relationship between these operations. In short, references such as "first," "second," etc. are used as labels for ease of reference in the description and the appended claims.

DETAILED DESCRIPTION

Figure 2:
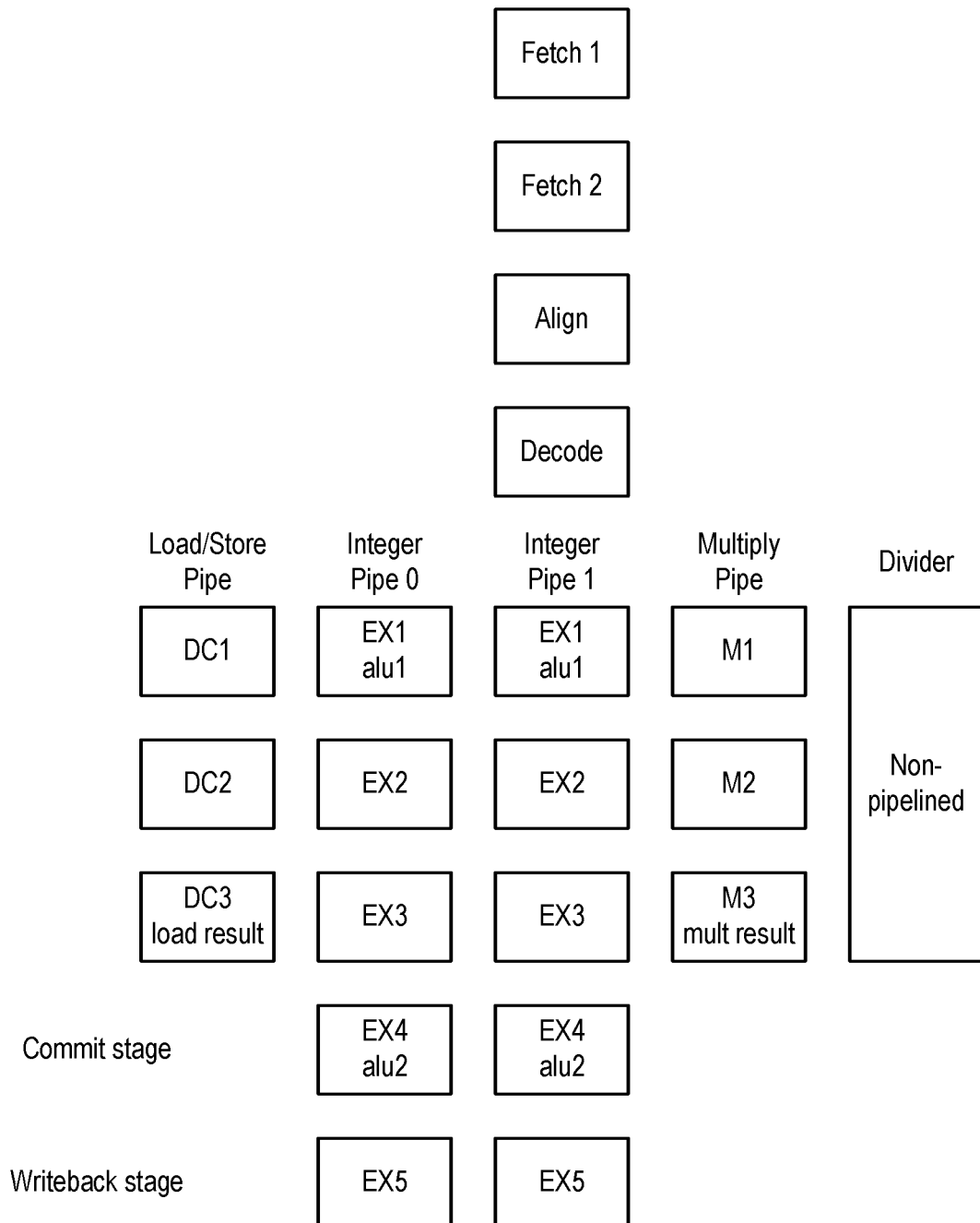
FIG. 2 is a diagram illustrating example pipeline stages, according to some embodiments.
Figure 3:
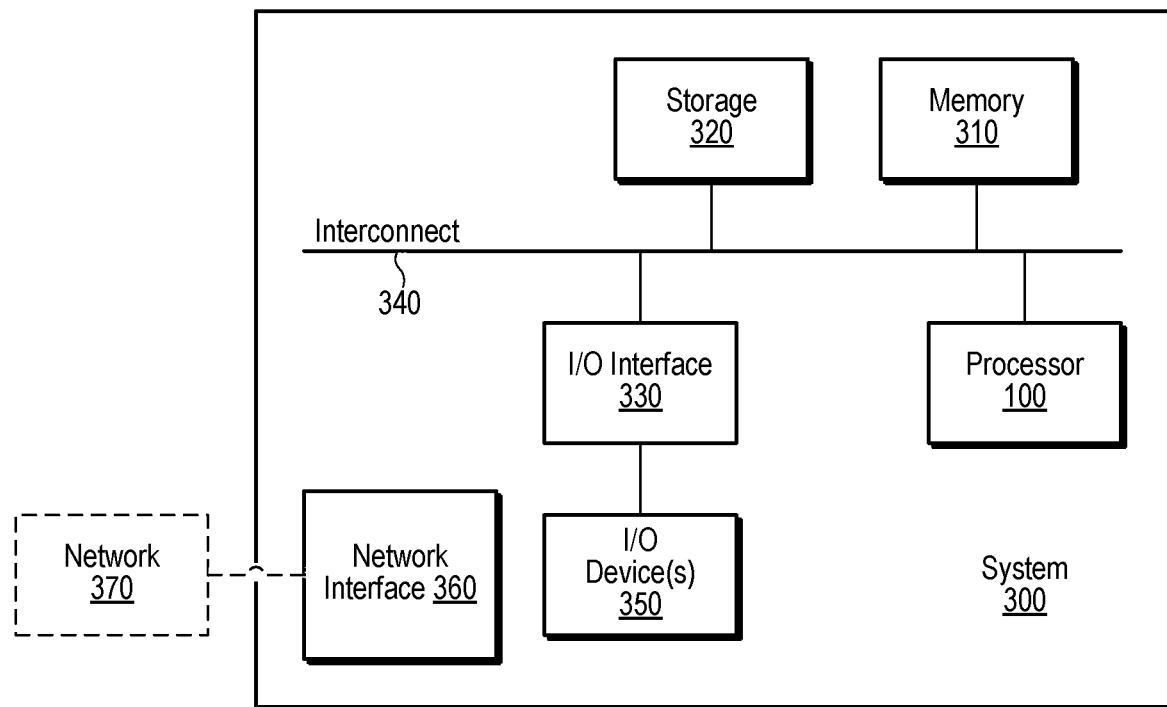
FIG. 3 is a diagram illustrating an example computing system, according to some embodiments.
Figure 4:
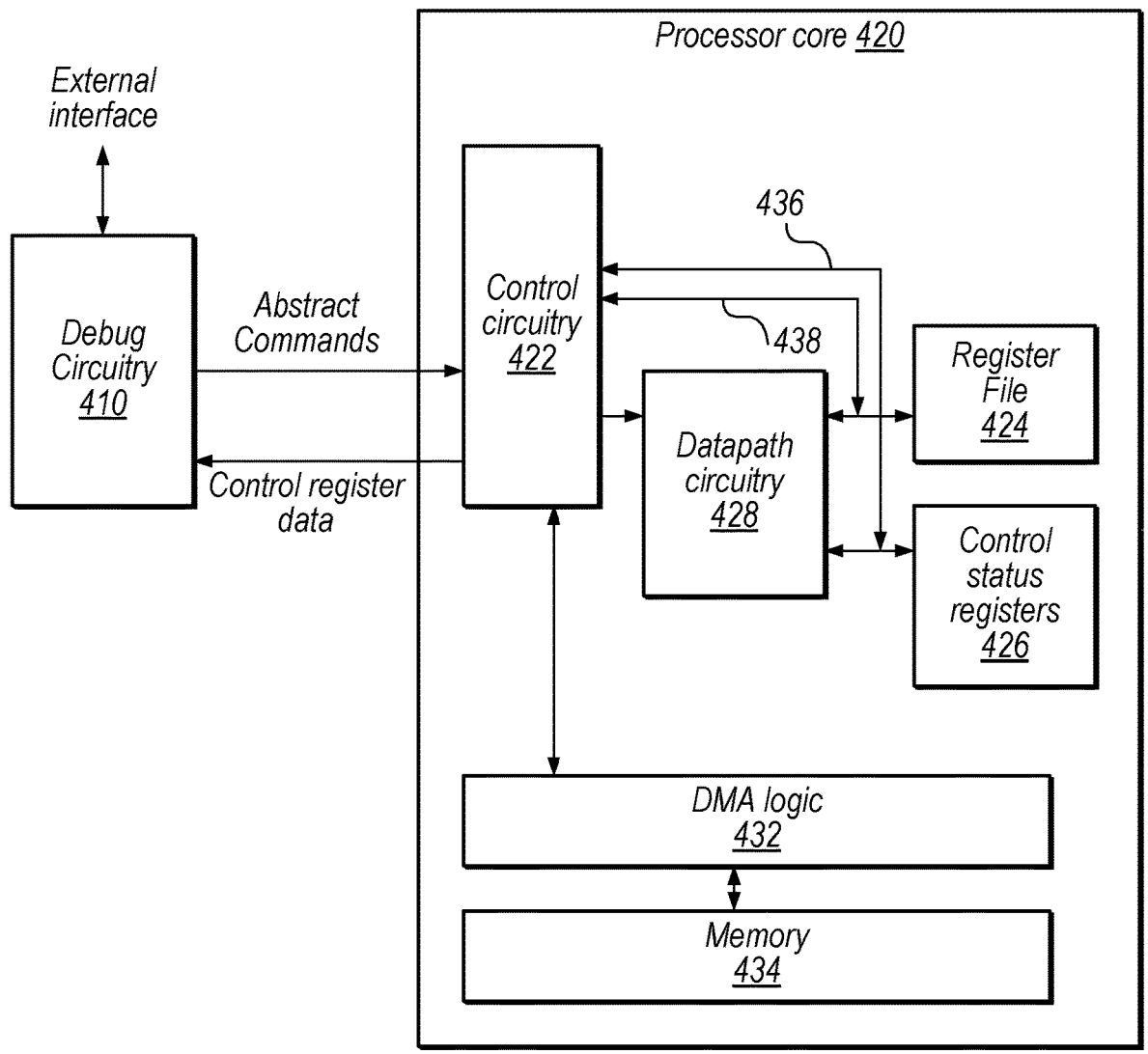
FIG. 4 is a block diagram illustrating an example processor core with debug control circuitry according to some embodiments.
Figure 5:
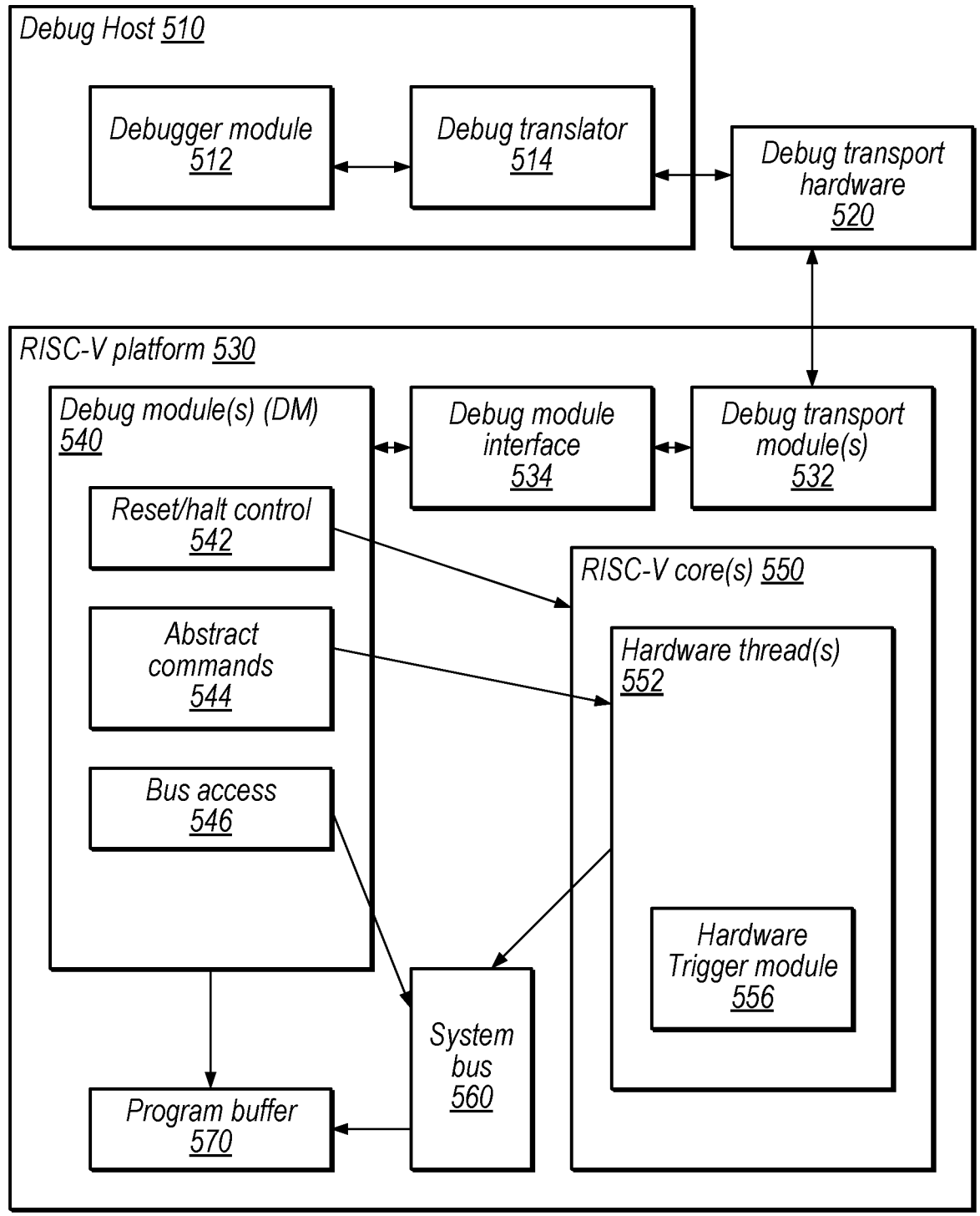
FIG. 5 is a block diagram illustrating an example RISC-V debugging architecture, according to some embodiments.
Figure 6:
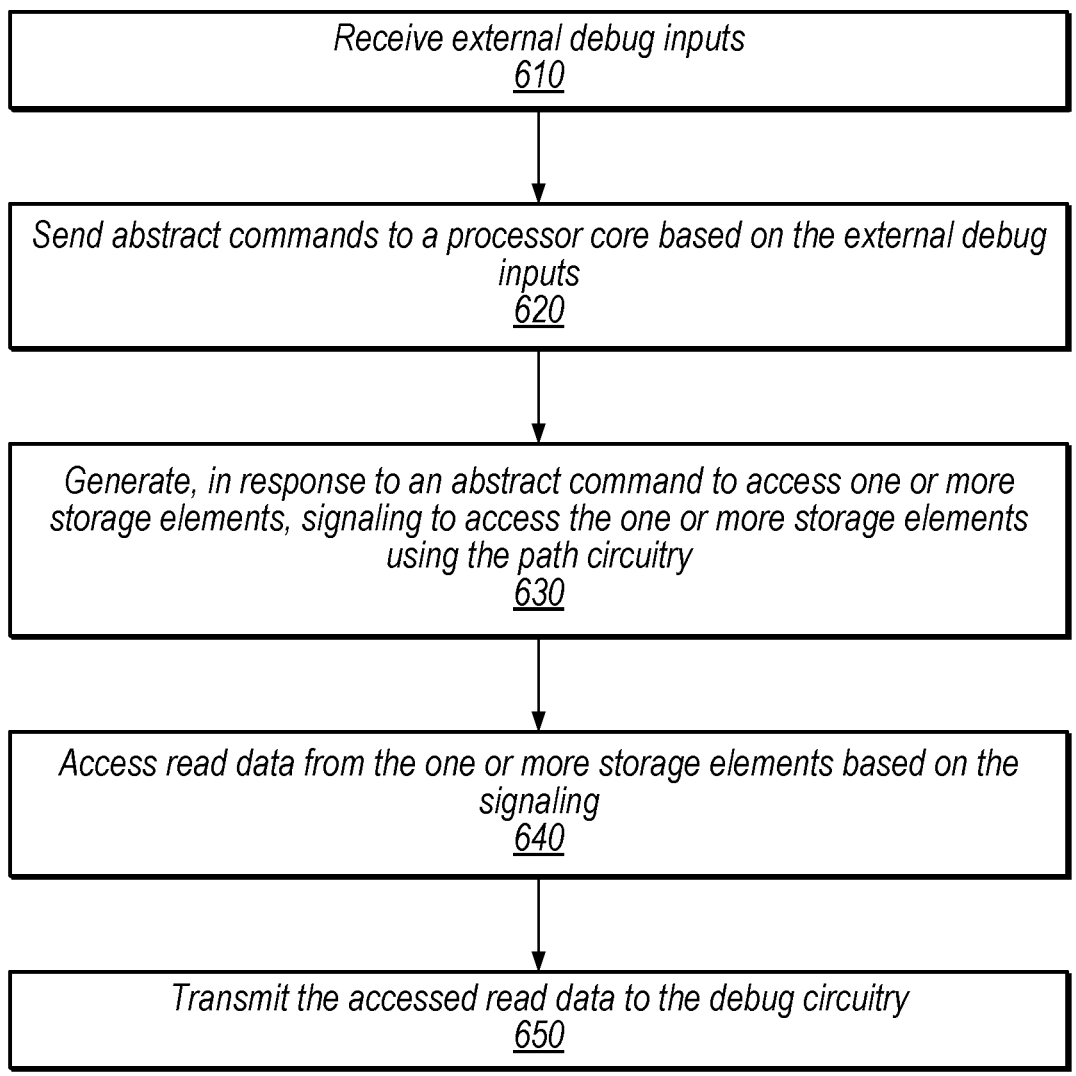
FIG. 6 is a flow diagram illustrating an example method for hardware debugging that includes accessing storage elements using existing path circuitry, according to some embodiments.

This disclosure initially describes, with reference to FIGS. 1-3, an overview of a processor and its execution pipeline along with an example system configuration in which the processor may be employed. With reference to FIG. 4 it then describes example hardware debugging techniques for accessing storage elements using existing path circuitry. FIG. 5 provides an overview of RISC-V debugging. FIG. 6 shows an example method.

Processor Overview

FIG. 1 illustrates an embodiment of a processor 100 organized according to a particular microarchitecture. In some embodiments, processor 100 is configured to implement the RISC-V instruction set architecture (ISA), although other embodiments may implement other suitable ISAs. Preliminarily, it is noted that the microarchitecture shown in FIG. 1 represents merely one possible and non-limiting implementation.

In the illustrated embodiment, processor 100 includes an execution core 110 that includes a number of circuits configured to perform various aspects of instruction execution. In particular, core 110 includes a fetch circuit 111 coupled to an aligner circuit 112, which is in turn coupled to a decoder circuit 113. Decoder circuit 113 is coupled to a number of instruction execution circuits, including first and second integer execution circuits respectively denoted IEX0 114 and IEX1 115, along with load/store circuit 116, multiplier circuit 117, and divider circuit 118. Additionally, processor 100 includes a memory processing unit 120, an instruction cache 130, a data cache 140, a bus interface unit 150, a programmable interrupt controller 160, a debug controller circuit 170, and a power management circuit 180.

Generally speaking, core 110 may be configured to fetch instructions and necessary data, execute instructions, and write results either locally (e.g., to a register file) or into a memory subsystem. In particular, fetch circuit 111 may be configured to initiate this process by retrieving instructions for execution. In various embodiments, fetch circuit 111 may be configured to implement program counter logic and branch prediction circuitry in order to track the flow of program execution and attempt to predict the outcome of conditional branches in order to speculatively fetch branch targets. For example, fetch circuit 111 may implement a "gshare"-style branch predictor in which a table of branch direction predictors is used in combination with a branch target buffer (i.e., a cache of branch target addresses) along with the current program counter and an indicator of global branch history to generate a predicted address from which to fetch instructions. Any suitable branch prediction scheme may be employed, however.

The fetch address generated by fetch circuit 111 may be directed to instruction cache 130. In some embodiments, instruction cache 130 may be implemented as a pipelined, banked, set-associative cache that is accessed by performing an index lookup and a tag comparison to verify that the fetch address is in fact present in the cache. In the event of a cache miss, the fetch address may be sent to bus interface unit 150 to be retrieved from external memory coupled to processor 100. In other embodiments, an instruction closely-coupled memory (ICCM) may be provided in addition to or instead of instruction cache 130. Generally speaking, a CCM is a storage array defined by a directly addressable region of memory addresses; it differs from a cache in that there is no possibility of an access "missing" a CCM and thus having a variable latency depending on its hit/miss status. A CCM may thus provide storage that has relatively low access latency that is also predictably consistent, unlike a cache, which may improve the performance of certain computing workloads such as real-time applications. In some embodiments, an instruction read-only memory (IROM) may be provided in addition to or instead of an ICCM; an IROM may provide similar access timing characteristics as an ICCM but has fixed contents (e.g., determined at the time of manufacture) and cannot be written to.

In some ISAs, instructions may have variable lengths. For example, the RISC-V ISA defines a set of 32-bit instructions as well as 16-bit "compressed" variants of a subset of the 32-bit instructions. Accordingly, in some embodiments, aligner circuit 112 may be configured to identify instruction boundaries within the fetch stream and extract the corresponding instructions for further processing. For example, aligner circuit 112 may be configured to identify RISC-V 16-bit compressed instructions and convert them to their uncompressed 32-bit variants for downstream processing, which may simplify later processing relative to preserving the compressed instructions in their native format. Decoder circuit 113 may be configured to receive fetched instructions from aligner circuit 112 and decode them in order to determine how they should be further processed within core 110. For example, decoder circuit 113 may examine the operand fields of instructions in order to determine instruction dependencies that may dictate when an instruction is ready to execute; if an instruction requires a result that is not yet available, decoder circuit 113 may delay its execution (and possibly the execution of upstream instructions) until its dependencies are satisfied. In some embodiments, decoder circuit 113 may attempt to group multiple instructions for concurrent execution. To simplify the complexity of this task, some embodiments of decoder circuit 113 may limit the number of instructions issued for concurrent execution. For example, although core 110 includes multiple execution units that could in theory operate concurrently, these execution units may be grouped such that only two instructions are issued per cycle by decoder circuit 113. In other embodiments, however, such limitations may not apply.

In some embodiments, decoder circuit 113 may implement additional operations. For example, decoder circuit 113 may detect synchronization attributes of particular instructions (e.g., instructions that may have special execution timing requirements relative to other instructions in order to ensure correct execution) and appropriately stall or freeze the execution pipeline in order to enforce those attributes. In some instances, decoder circuit 113 may also include a register file configured to implement the architected registers defined by the ISA and/or control/status registers defined by the ISA or the particular processor implementation, although these features may alternatively be implemented elsewhere within core 110.

Once processed by decoder circuit 113, instructions may then be issued to the appropriate execution circuit for execution. In the illustrated embodiment, core 110 includes two integer execution circuits IEX0 114 and IEX1 115, each of which may implement circuitry for executing arithmetic, logical, and shift instructions defined by the ISA. In the illustrated embodiment, IEX0 114 and IEX1 115 are each configured to implement two arithmetic/logic units (ALUs), for a total of four ALUs. As will be discussed below with respect to FIG. 2, the ALUs in each execution circuit may be configured to operate in successive pipeline stages rather than concurrently, in order to facilitate bypassing of results from one execution circuit to another.

In addition to the integer execution circuits, load/store circuit 116 may be configured to execute load and store instructions defined by the ISA. For example, load/store circuit 116 may be configured to perform address generation arithmetic and to present the resulting address to data cache 140 for processing. In some embodiments, like instruction cache 130, data cache 140 may be implemented as a pipelined, banked, set-associative cache that is accessed by performing an index lookup and a tag comparison to verify that the address targeted by the load or store instruction is in fact present in the cache. In the event of a data cache miss, the address may be sent to bus interface unit 150 to be retrieved from external memory coupled to processor 100. In some embodiments, a data closely-coupled memory (DCCM) may be provided in addition to or instead of data cache 140. As noted above, a CCM may effectively operate as a directly addressable on-chip memory with predictable access latency, in contrast to a cache that has a variable, probabilistic access latency. In embodiments that implement only a DCCM without a data cache, accesses within the memory range associated with the DCCM may be routed to the DCCM, whereas accesses outside of that range may ultimately be handled by bus interface unit 150.

Multiplier circuit 117 may be configured to implement integer multiplication instructions defined by the ISA. Divider circuit 118 may be configured to implement integer division instructions defined by the ISA. While multiplier circuit 117 may be pipelined, integer division is typically a complex, long-latency operation. Accordingly, in the illustrated embodiment, divider circuit 118 is implemented as a non-pipelined circuit, and instructions dependent on the results of an integer division instruction will stall until the division is complete. It is noted that while floating-point arithmetic is not explicitly discussed above, embodiments of core 110 may include execution circuits that support such operations.

As shown in FIG. 1, processor 100 includes memory processing unit (MPU) 120 interposed between core 110 and other elements of the memory hierarchy, such as instruction cache 130, data cache 140, and bus interface unit 150. In some embodiments, MPU 120 may include circuitry that supports the load/store pipeline, such as buffers and queues. For example, once load/store circuit 116 computes a memory address (or, in some cases, once fetch circuit 111 computes a fetch address), in some embodiments a memory access may be enqueued within MPU 120 while awaiting downstream processing. Similarly, MPU 120 may implement a store buffer that is configured to hold post-commit store instructions (i.e., store instructions that have been completed and are intended to modify programmer-visible state) until they can be written to the memory subsystem via bus interface unit 150. It is noted that in other embodiments, some or all of the features of MPU 120 may be implemented elsewhere within processor 100, such as within load/store circuit 116. Additionally, in some embodiments, MPU 120 may implement protection features that, for example, enforce a privilege model or otherwise restrict access to defined addresses or regions of the memory address space, which may improve the stability and security of code execution. In embodiments of processor 100 that support virtual memory addressing, MPU 120 may additionally include circuitry related to address translation such as translation lookaside buffers (TLBs). As noted above, however, translation circuitry may be located elsewhere within processor 100 depending on design considerations (e.g., whether caches/CCMs are virtually or physically addressed).

Bus interface unit (BIU) 150 may be configured to interface processor 100 with other devices, such as memory, input/output devices, or other peripherals. External devices may either be on-chip (e.g., on the same silicon as processor 100, as in a system-on-a-chip (SoC) implementation) or off-chip. In some embodiments, BIU 150 may interface with external devices according to a version of the Advanced Microcontroller Bus Architecture (AMBA) standard, such as the Advanced High-performance Bus (AHB) bus protocol introduced in the AMBA 2 specification. Any other suitable bus architecture or protocol may be employed, however. BIU 150 may include circuits such as load and store queues configured to store pending load and store instructions as well as state machines or other circuits configured to implement the appropriate bus transaction logic.

In some embodiments of processor 100 that include an ICCM and/or a DCCM, these memory structures may be accessible via direct memory access (DMA) by off-processor devices in addition to being accessed by instructions executing in core 110. In such embodiments, processor 100 may include arbitration circuitry configured to arbitrate competing ICCM/DCCM accesses originating from processor 100 and DMA. For example, processor accesses may generally take priority over DMA accesses, although the arbitration circuitry may employ fairness and/or performance factors to ensure that DMA accesses are eventually serviced. In some embodiments, an ICCM/DCCM may be implemented in a banked manner with arbitration being performed on a per-bank basis, so that different banks may concurrently service accesses from processor 100, DMA, or a combination of these.

Programmable interrupt controller (PIC) 160 may be configured to facilitate the processing of interrupts originating externally to processor 100, such as asynchronous interrupts from peripherals that need to perform input/output. In various embodiments, PIC 160 may implement circuitry configured to prioritize and mask interrupts according to user-programmable specifications, to support vectoring of interrupts to corresponding dedicated interrupt handler locations in memory, to support nesting and chaining of concurrent or successive interrupts, or any other suitable interrupt-related processing. In some embodiments, PIC 160 may process exceptions or faults arising from instruction execution within core 110 in addition to external interrupts.

Debug controller circuit 170 may be configured to implement a variety of debug-related features. For example, RISC-V defines an extensive debugging interface that can enable software to inspect and control the operation of processor 100 at a fine level of granularity. To support these features, debug controller circuit 170 may implement features such as breakpoints, timers, or other event-related triggers that, for example, facilitate pausing of instruction execution when defined events are detected, so that a user can inspect the state of processor 100 and associated memory at that time. Such features, along with features such as single-step execution, may facilitate the debugging of software executing on processor 100.

Some features of debug controller circuit 170 may also be used to perform hardware debug/test, for example as part of a silicon development or manufacturing test scenario. For example, debug controller circuit 170 may implement a command interface that may be accessible either via software or via hardware test features such as JTAG ports. The command interface may enable a user to read and/or write state elements within processor 100, such as register files, memory arrays, and the like. Thus, debug controller circuit 170 may facilitate the injection of test code into processor 100 in order to verify or debug a partially-operative hardware system.

Lastly, power management circuit 180 may be configured to coordinate power management features across processor 100. For example, power management circuit 180 may be configured to implement support for architecturally-defined power management states and to correctly transition processor 100 across those states, e.g., by controlling the sequence in which circuits of processor 100 are energized or depowered. Power management circuit 180 may also be configured to implement other power management features that are not necessarily architecturally defined, such as detecting and depowering idle circuits in order to decrease power consumption.

FIG. 2 is a pipeline diagram illustrating the execution timing of an embodiment of processor 100. As shown, instruction execution proceeds from top to bottom in a nine-stage pipeline, and each row of FIG. 2 represents one execution cycle. In this implementation, the operation of fetch circuit 111 is split across two cycles (denoted Fetch 1 and Fetch 2), during which instruction memory access occurs (e.g., to cache, ICCM, or IROM) and fetch buffers containing unaligned fetch results are populated. A stall may occur at the Fetch 1 stage in the event of a cache miss or line fill condition.

Operation of aligner circuit 112 occurs in the Align stage. A stall may occur here in certain cases of misalignment. For example, if multiple fetch buffers need to be scanned to identify instructions to be decoded, a stall may be necessary.

Decoder circuit 113 operates during the Decode stage. In one embodiment, decoder circuit 113 attempts to identify up to two instructions that can be issued together for execution, subject to dependencies, although other embodiments may attempt to identify greater degrees of concurrency. Stalls may occur at the Decode stage based on dependencies, instruction synchronization requirements, or other factors.

Following the Decode stage, processing depends upon which execution circuit an instruction is routed to. Instructions destined for integer execution circuits IEX0 114 or IEX1 115 enter the EX1 stage of Integer Pipe 0 or Integer Pipe 1, respectively. As discussed above, in one embodiment, IEX0 114 and IEX1 115 may each include 2 ALUs, one of which executes at the EX1 stage, and the other of which executes at the EX4 stage. As can be seen relative to the other execution circuit pipelines, including an ALU at the EX4 stage may enable forwarding of results from other execution circuits, and may prevent some instances of dependency-related stalls.

As shown, instruction commit decisions occur during the EX4 or Commit stage. For example, by the end of EX4, all speculative conditions that would prevent an instruction result from properly being committed to architectural state (such as branch mispredictions, exceptions, interrupts, or similar conditions) should be resolved. Either invalid state will be flushed or the instruction currently at EX4 will be permitted to modify architectural state at the EX5 or Writeback stage.

Load/store instructions enter the DC1 stage of the Load/Store Pipe and proceed to perform address generation and cache/DCCM lookup. In the illustrated case, loads and stores are effectively complete at the DC3 stage and can be forwarded, although they still need to proceed to the Commit and Writeback stages before they can be allowed to persistently modify architectural state.

Multiply instructions enter the M1 stage of the Multiply Pipe. As shown, the Multiply Pipe has similar timing to the Load/Store Pipe, with results available for forwarding at the M3 stage. Like load/store instructions, however, multiply instructions still proceed to the Commit and Writeback stages prior to persistently modifying architectural state.

In some embodiments, the Load/Store Pipe and Integer Pipe 0 may be treated as a unit for instruction issue purposes. That is, during a given cycle, decoder circuit 113 may issue an instruction to one of these pipelines, but not the other. Integer Pipe 1 and the Multiply Pipe may be treated as a similar unit, such that decoder circuit 113 may issue up to two instructions per cycle for execution. In other embodiments, more aggressive issue scheduling may be implemented.

As noted above, divide instructions are issued from decoder circuit 113 to divider circuit 118, although in the illustrated embodiment, divide operations are long-latency, unpipelined operations. For completeness, the divider path is shown in FIG. 2 as an issue path alongside the remaining execution pipelines.

Example Computing System

Processor 100 may be included within a variety of system configurations, one example of which is shown in FIG. 3. In various embodiments, system 300 may correspond to a general-purpose computer system, such as a desktop or portable computer, a mobile phone, or the like. System 300 may also correspond to any type of embedded system that may employ one or more instances of processor 100 as a dedicated controller. For example, system 300 may correspond to any type of computer peripheral device such as a mass storage device or storage array, printer, or the like, as well as control systems for automobiles, aviation, manufacturing, and other suitable applications.

As shown, system 300 includes processor 100, memory 310, storage 320, and an input/output (I/O) device interface 330 coupled via an interconnect 340. One or more I/O devices 350 are coupled via I/O interface 330. System 300 also includes a network interface 360 that may be configured to couple system 300 to a network 370 for communications with, e.g., other systems. (In various embodiments, network interface 360 may be coupled to interconnect 340 directly, via I/O interface 330, or according to a different configuration.) It is noted that some or all of the components of system 300 may be fabricated as a system-on-a-chip, although discrete combinations of components may also be employed.

Processor 100 corresponds to one or more instances of the processor configuration described above with respect to FIGS. 1-2, or a suitable variant thereof. Memory 310 may include random access memory (RAM) of any suitable configuration, such as working memory configured to store data and instructions usable by processor 100. Storage 320 may include mass storage devices such as magnetic, optical, or nonvolatile/flash memory storage, or a combination of these. In some embodiments, either of memory 310 or storage 320 may be omitted or integrated into the other as a single memory subsystem from the perspective of processor 100.

I/O interface 330 may be configured to interface between interconnect 340 and one or more other types of buses or interfaces. For example, interconnect 340 may correspond to the AHB interface discussed above (or another suitable type of high-bandwidth interconnect), and I/O interface 330 may be configured as a bridge device that enables coupling of different types of I/O devices to interconnect 340. I/O interface 330 may implement one or more interface protocols such as Universal Serial Bus, Firewire, or other suitable standards. I/O device(s) 350 may include any suitable type of storage, network interface, user interface, graphics processing, or other type of device. Network 370, if present, may be any suitable type of wired or wireless communications network, such as an Internet Protocol (IP) addressed local or wide-area network, a telecommunications network, or the like. Network interface 360, if present, may be configured to implement any suitable network interface protocol needed for communication with network 370.

Overview of Debug Techniques Using Path Circuitry from Non-Debug Modes

In various embodiments, a processor includes debug circuitry and one or more processor cores. As one example, the debug circuitry may be a debug module (DM) and the processor cores may be RISC-V cores. In some embodiments, the debug circuitry communicates with the processor using intermediate debug commands (e.g., abstract commands as discussed in the RISC-V debug specification) to access processor data. The intermediate commands may identify the debug operations to be performed without specifying how the specific processor core implementation is to perform those operations. The discussion below relates to techniques for advantageously implementing such commands in the processor core using existing datapath circuitry. For example, in some embodiments an execution pipeline or a direct memory access (DMA) controller is used to implement debug commands. This may reduce debug circuitry (e.g., relative to using dedicated access ports for debug commands) which may advantageously reduce processor area and complexity or improve debug performance.

FIG. 4 is a block diagram illustrating an example processor that includes debug circuitry 410 and a processor core 420. In the illustrated embodiment, debug circuitry includes an external interface. This interface may be used by a debug host to control debugging of the processor. In some embodiments, this interface is a join test action group (JTAG)-specified interface, such as an interface that implements the IEEE 1149.1-2013 standard.

Debug circuitry 410, in the illustrated embodiment, receives debug control signals from the external interface and generates abstract commands based on these signals. These commands may specify an action to perform and parameters for the action, but may be not specify specific operations to perform the action. One example of an abstract command is an "access register" command that includes fields to specify access size, a number of registers to access, whether post-increment occurs on the number of registers, whether a program buffer should be executed after the transfer, whether to read or write, and whether to perform the access (e.g., this field may indicate not to perform the access in order to simply execute instructions in a program buffer). Other examples of abstract commands include a "quick access" command and an "access memory" command, e.g., as specified in the draft version of the RISC-V external debug support specification version 0.13.1.

Note that, although various examples are discussed herein with reference to RISC-V, this discussion is not intended to limit the scope of the present disclosure. Rather, the disclosed techniques may be used for processors of various instruction set architectures that include features similar to those discussed herein.

Processor core 420, in the illustrated embodiment, includes control circuitry 422, register file 424, control status registers 426, datapath circuitry 428, DMA logic 432, and memory 434. In some embodiments, path circuitry (e.g., datapath circuitry 428 and DMA logic 432) is configured to access data for instructions executed by core 420. For example, these paths may be assigned one or more read and one or more write ports to data storage elements (e.g., register file 424, control status registers 426, and memory 434).

Control circuitry 422, in the illustrated embodiment, is configured to generate signaling based on abstract commands from debug circuitry 410 to use path circuitry to access one or more storage elements.

For example, for general purpose register (GPR) reads and writes, the control circuitry 422 may convert a register access abstract command to an architectural OR instruction. For example, in the RISC-V architecture, the x0 register is defined as representing zero. Therefore, ORing this register with another register will output the value of the other register.

In some embodiments, for a GPR read, the control circuitry 422 is configured to generate an instruction "OR x0, gpr, x0" to logically OR x0 and the specified GPR and store the result in x0 (which will cause no change in register state, because x0 is hardwired, in some embodiments). In some embodiments, control circuitry 436 then intercepts the value from the register file via intercept path 438. In some embodiments, this may avoid adding an additional port to the register file 424 by using a port for datapath circuitry 428 instead.

In some embodiments, for a GPR write, control circuitry 422 is configured to generate an instruction "OR gpr, x0, x0" to logically OR x0 with itself and write the result to the specified GPR. Rather than writing the OR result, however, control circuitry 422 is configured to interject the desired value to be written to the specified GPR via intercept path 438, in some embodiments.

In some embodiments, for a control status register (CSR) read, control circuitry 422 is configured to generate an instruction "csrrs x0, csr, x0." In some embodiments, the CSRRW (Atomic Read/Write CSR) instruction atomically swaps values in the specified CSRs and integer registers. In some embodiments, CSRRW reads the old value of the CSR, zero-extends the value to XLEN bits, then writes it to register x0. The initial value in x0 is written to the CSR. In some embodiments, using this instruction with x0 allows control circuitry 422 to use intercept circuitry 436 to intercept the value of the CSR from control status registers 426 without requiring a separate debug port for the CSRs.

In some embodiments, for a control status register (CSR) write, control circuitry 422 is configured to generate an instruction "csrrs x0, csr, x0." In some embodiments, the CSRRS (Atomic Read and Set Bit in CSR) instruction reads the value of the specified CSR, zero-extends the value to XLEN bits, and writes it to integer register x0. In some embodiments, the initial value in integer register specifies bit positions to be set in the CSR. In some embodiments, control circuitry 422 uses intercept circuitry 436 to insert the value to be written to the specified CSR.

For memory access, in some embodiments, control circuitry 422 is configured to request DMA logic to stop accepting requests from DMA masters and wait for a ready signal from DMA logic 432. In some embodiments, DMA then sends a read or write memory access command to the DMA logic 432, which writes the provided data to the specified location or provides read data from the specified location to control circuitry 422. In some embodiments, DMA logic 432 allows access to both instruction and data memory. In some embodiments, this may allow access to ICCM and DCCM memories, for example. In some embodiments, using DMA to access memory for debug may advantageously allow access to instruction memories, which may not be accessible by generating architectural instructions.

In some embodiments, other paths may be used in addition to or in place of a DMA path. As one example, a load/store path may be used to access DCCM memory, in some embodiments.

In some embodiments, control circuitry 422 uses control registers to communicate read data with debug circuitry 410. In other embodiments, any of various interfaces may be implemented to communicate between debug circuitry 410 and control circuitry 422 to insert and/or intercept data using paths that are also used in non-debug modes.

Overview of RISC-V Debug Architecture

As discussed above, in some embodiments the disclosed techniques may be performed in the context of the RISC-V architecture. FIG. 5 is a block diagram based on FIG. 2.1 of version 0.13.1 of the RISC-V External Debug Support specification. In some embodiments, a user interacts with the debug host 510 (e.g., a laptop computer) that runs a debug module 512 such as gdb. The debug translator 514 (e.g., openOCD) communicates with debug transport hardware 520 (e.g., a USB-JTAG adapter) which connects to one or more debug modules 540 on the RISC-V platform 530 (e.g., via debut transport module(s) 532 and debug module interface 534). Debug module(s) 540 represent an embodiment of debug circuitry 410.

In the illustrated embodiment, debug module(s) 540 communicate with RISC-V core(s) 550 using reset/halt control module 542, abstract commands module 544, and bus access module 546. As shown, debug module(s) 540 may send reset/halt control signaling and abstract commands to the cores and may also access system bus 560 and program buffer 570.

The program buffer 570 may allow the debugger to execute arbitrary instructions and/or access memory. In some embodiments, the disclosed techniques do not use a program buffer, but the RISC-V core(s) 550 implements control units configured to convert abstract commands to other signaling (e.g., instructions or DMA commands). In other embodiments, the debug modules 540 may generate instructions for the program buffer based on abstract commands. Hardware debugging that does not use the program buffer may be advantageous relative to such software debugging, however, in certain instances, to avoid executing instructions during debug. In some embodiments, bus access module 546 allows the debug module to access memory (that is external to the processor core) without using a processor core.

The RISC-V core(s) 550, in the illustrated embodiment, each implement one or more hardware thread(s) 552 which include a hardware trigger module 556. The trigger module may allow a core to halt and inform a debug module 540 when trigger conditions are met.

FIG. 6 is a flow diagram illustrating a method for hardware debugging that includes accessing storage elements using existing path circuitry, according to some embodiments. The method shown in FIG. 6 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 610, in the illustrated embodiment, debug circuitry of a processor receives external debug inputs.

At 620, in the illustrated embodiment, the debug circuitry sends abstract commands to a processor core based on the external debug inputs. In some embodiments, the processor core includes path circuitry configured to access data for instructions executed by the processor core and a plurality of storage elements. In some embodiments, the path circuitry is configured to access the storage elements via one or more ports.

At 630, in the illustrated embodiment, control circuitry in the processor generates signaling to access the one or more storage elements using the path circuitry. In the illustrated embodiment, the control circuitry generates the signaling in response to an abstract command to access one or more of the storage elements.

In some embodiments, the signaling is an OR instruction that specifies a logical OR of logical zeros with the contents of one or more general purpose registers. In some embodiments, the signaling is an instruction that transfers a value between one or more control status registers and one or more other registers. In some embodiments, the signaling includes a direct memory access (DMA) command to DMA circuitry of the apparatus.

At 640, in the illustrated embodiment, the control circuitry accesses read data from the one or more storage elements based on the signaling. In some embodiments, the accessing uses an intercept path between the one or more storage elements and the path circuitry.

At 650, in the illustrated embodiment, the control circuitry transmits the accesses read data to the debug circuitry.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a processor core that includes:
   control circuitry;
   path circuitry configured to access data for instructions executed by the processor core;
   a plurality of storage elements, wherein the path circuitry is configured to access the storage elements via a port; and
   intercept circuitry configured to intercept, between the port and the path circuitry, data accessed from the storage elements and provide the intercepted data to the control circuitry; and
   debug circuitry configured to receive external debug inputs and send abstract commands to the processor core based on the external debug inputs;
   wherein the control circuitry is configured to, in response to an abstract command to access one or more of the storage elements:
   generate an instruction that causes data to be read from one or more of the plurality of storage elements such that the read data proceeds to the path circuitry and the intercept circuitry, wherein the path circuitry is configured to execute the instruction to process the read data and the execution does not change the architectural state of the processor core;
   access, via the intercept circuitry, the read data based on the execution of the instruction; and
   transmit the accessed read data to the debug circuitry.

2. The apparatus of claim 1, wherein the one or more storage elements include one or more general purpose registers and the instruction is an OR instruction that specifies a logical OR of logical zeros with the contents of the one or more general purpose registers.

3. The apparatus of claim 1, wherein the one or more storage elements include one or more control status registers and the instruction is an instruction that transfers a value between the one or more control status registers and one or more other registers.

4. The apparatus of claim 3, wherein the instruction that transfers the value is a RISC-V csrrs or csrrw instruction.

5. The apparatus of claim 1, wherein the control circuitry is further configured to:
   insert write data from the debug circuitry for storage in the one or more storage elements.

6. The apparatus of claim 1, wherein the one or more storage elements include memory and the control circuitry is further configured to issue a direct memory access (DMA) command to DMA circuitry of the apparatus based on an abstract command.

7. The apparatus of claim 6, wherein the control circuitry is further configured to send a request to the DMA circuitry to stop accepting requests and to wait to send the DMA command until the DMA circuitry sends a ready signal.

8. A method, comprising:
receiving, by debug circuitry of a processor, external debug inputs;
sending, by the debug circuitry, abstract commands to a processor core based on the external debug inputs, wherein the processor core includes:
control circuitry;
a plurality of storage elements,
path circuitry that accesses data for instructions executed by the processor core, including accessing the storage elements via one or more ports; and
intercept circuitry that intercepts, between the port and the path circuitry, data accessed from the storage elements and provides the intercepted data to the control circuitry;
generating, by the control circuitry in response to an abstract command to access one or more of the storage elements, an instruction that causes data to be read from one or more of the plurality of storage elements such that the read data proceeds to the path circuitry and the intercept circuitry;
executing, by the path circuitry, the instruction to process the read data, wherein the executing does not change the architectural state of the processor core;
accessing, by the control circuitry via the intercept circuitry, the read data based the execution of the instruction; and
transmitting the accessed read data to the debug circuitry.

9. The method of claim 8, wherein the instruction is an OR instruction that specifies a logical OR of logical zeros with the contents of one or more general purpose registers.

10. The method of claim 8, wherein the instruction transfers a value between one or more control status registers and one or more other registers.

11. The method of claim 8, further comprising:
inserting write data from the debug circuitry for storage in the one or more storage elements.

12. A non-transitory computer readable storage medium having stored thereon design information that specifies a design of at least a portion of a hardware integrated circuit in a format recognized by a semiconductor fabrication system that is configured to use the design information to produce the circuit according to the design, including:
a processor core that includes:
control circuitry;
path circuitry configured to access data for instructions executed by the processor core;
a plurality of storage elements, wherein the path circuitry is configured to access the storage elements via a port; and
intercept circuitry configured to intercept, between the port and the path circuitry, data accessed from the storage elements and provide the intercepted data to the control circuitry; and
debug circuitry configured to receive external debug inputs and send abstract commands to the processor core based on the external debug inputs;
wherein the control circuitry is configured to, in response to an abstract command to access one or more of the storage elements:
generate an instruction that causes data to be read from one or more of the plurality of storage elements such that the read data proceeds to the path circuitry and the intercept circuitry, wherein the path circuitry is configured to execute the instruction to process the read data and the execution does not change the architectural state of the processor core;
access, via the intercept circuitry, the read data based on the execution of the instruction; and
transmit the accessed read data to the debug circuitry.

13. The non-transitory computer readable storage medium of claim 12, wherein the one or more storage elements include one or more general purpose registers and the instruction is an OR instruction that specifies a logical OR of logical zeros with the contents of the one or more general purpose registers.

14. The non-transitory computer readable storage medium of claim 12, wherein the one or more storage elements include one or more control status registers and the instruction transfers a value between the one or more control status registers and one or more other registers.

15. The non-transitory computer readable storage medium of claim 12, wherein the control circuitry is further configured to:
insert write data from the debug circuitry for storage in the one or more storage elements.

* * * * *